US008216888B2

(12) United States Patent
Chuang et al.

(10) Patent No.: US 8,216,888 B2
(45) Date of Patent: Jul. 10, 2012

(54) ELIMINATING POLY UNI-DIRECTION LINE-END SHORTENING USING SECOND CUT

(75) Inventors: Harry Chuang, Hsin-Chu (TW); Kong-Beng Thei, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/079,435

(22) Filed: Apr. 4, 2011

(65) Prior Publication Data

US 2011/0183506 A1 Jul. 28, 2011

Related U.S. Application Data

(62) Division of application No. 12/340,113, filed on Dec. 19, 2008, now Pat. No. 7,939,384.

(51) Int. Cl.
*H01L 21/82* (2006.01)

(52) U.S. Cl. . 438/129; 438/587; 438/669; 257/E21.632; 257/E21.19; 257/E21.184

(58) Field of Classification Search .............. 438/129, 438/587, 669; 257/E21.632, E21.19, E21.184
See application file for complete search history.

(56) References Cited

U.S. PATENT DOCUMENTS

| 5,598,010 | A | 1/1997 | Uematsu |
| 5,686,338 | A | 11/1997 | Liu |
| 5,923,969 | A | 7/1999 | Oyamatsu |
| 6,074,938 | A | 6/2000 | Asamura |
| 6,103,592 | A | 8/2000 | Levy et al. |
| 6,153,919 | A | 11/2000 | Sjödin et al. |
| 6,287,904 | B1 | 9/2001 | Lee et al. |
| 6,461,906 | B1 | 10/2002 | Lung |
| 6,492,073 | B1 | 12/2002 | Lin et al. |
| 6,787,469 | B2 | 9/2004 | Houston et al. |
| 6,944,844 | B2 | 9/2005 | Liu |
| 7,432,179 | B2 | 10/2008 | Chuang et al. |
| 2002/0160590 | A1 | 10/2002 | Hashimoto et al. |
| 2004/0092089 | A1 | 5/2004 | Thakar et al. |
| 2004/0099924 | A1 | 5/2004 | Nakata et al. |
| 2008/0171406 | A1 | 7/2008 | Orimoto et al. |
| 2008/0305599 | A1 | 12/2008 | Chuang et al. |
| 2009/0315079 | A1 | 12/2009 | Tien et al. |

FOREIGN PATENT DOCUMENTS

JP 2002-270538 A 9/2002

OTHER PUBLICATIONS

Auth, C., et al., "45nm High-k+ Metal Gate Strain-Enhanced Transistors," Intel® Technology Journal, Intel's 45nm CMOS Technology, vol. 12, Issue 2, Jun. 17, 2008, 12 pgs.

*Primary Examiner* — Michelle Mandala
(74) *Attorney, Agent, or Firm* — Slater & Matsil, L.L.P.

(57) ABSTRACT

A method of forming an integrated circuit structure includes providing a substrate including a first active region and a second active region; forming a gate electrode layer over the substrate; and etching the gate electrode layer. The remaining portions of the gate electrode layer include a first gate strip and a second gate strip substantially parallel to each other; and a sacrificial strip unparallel to, and interconnecting, the first gate strip and the second gate strip. The sacrificial strip is between the first active region and the second active region. The method further includes forming a mask layer covering portions of the first gate strip and the second gate strip, wherein the sacrificial strip and portions of the first gate strip and the second gate strip are exposed through an opening in the mask layer; and etching the sacrificial strip and the portions of the first gate strip and the second gate strip through the opening.

11 Claims, 12 Drawing Sheets

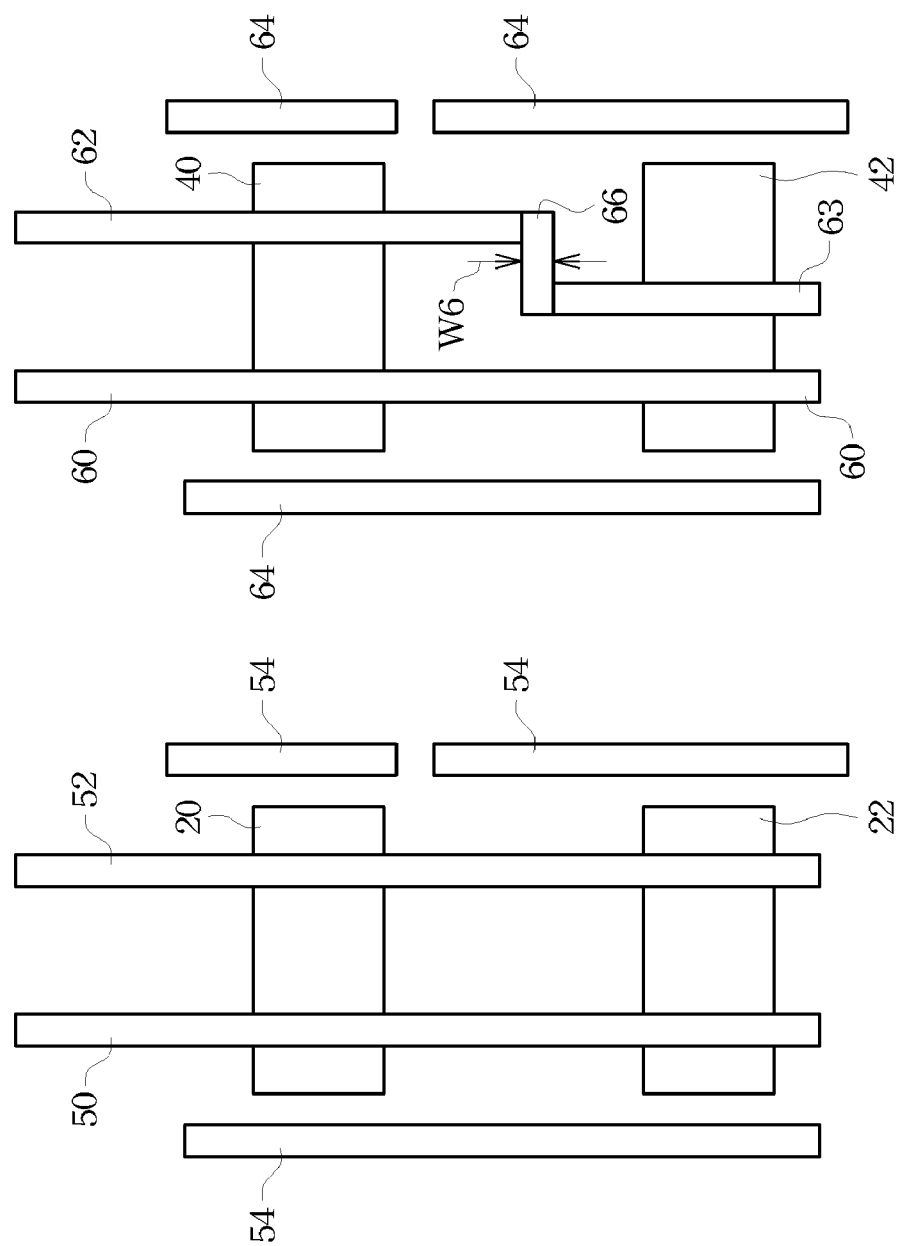

ELIMINATING POLY UNI-DIRECTION LINE-END SHORTENING USING SECOND CUT

This application is a divisional of U.S. patent application Ser. No. 12/340,113, entitled "Eliminating Poly Uni-Direction Line-End Shortening Using Second Cut," filed Dec. 19, 2008, which application is hereby incorporated herein by reference.

CROSS-REFERENCES TO RELATED APPLICATIONS

This application relates to the following commonly-assigned U.S. Patent Applications: U.S. patent application Ser. No. 11/012,414, filed Dec. 15, 2004, and entitled "Gate Control And Endcap Improvement;" and U.S. patent application Ser. No. 12/193,538, filed Aug. 18, 2008, and entitled "Gate Control and Endcap Improvement;" which applications are hereby incorporated herein by reference.

TECHNICAL FIELD

This invention relates to integrated circuit manufacturing processes, and specifically to endcap improvement through second cut process performed on gate electrode strips.

BACKGROUND

Lithography techniques are key techniques in the manufacturing of integrated circuits. In a lithograph process, a photo resist is first applied on a wafer, a mask containing patterns of the desirable features is then placed over the wafer, the photo resist is then exposed to light, wherein due to the patterns on the mask, some portions of the photo resist are exposed to light, and some portions are not. The photo resist is then developed, with the exposed (or unexposed) portions removed. The patterns on the mask are thus transferred to the photo resist.

Due to the use of light in the exposure of the photo resist, when two devices on the wafer are too close to each other, optical proximity effects occur. Optical proximity effects are due to light diffraction and interference between closely spaced features, resulting in the widths of lines in the lithographic image being affected by other nearby features.

The proximity effects affect the process control in gate formation, which in turn results in endcap problems. FIG. 1 illustrates a conventional layout comprising two metal-oxide-semiconductor (MOS) devices. Gate 102 and active region 106 form a first MOS device 108. Gate 104 and active region 107 form a second MOS device 105. Gates 102 and 104 have endcaps 109 and 111 extending beyond active regions 106 and 107, respectively. Due to the micro-loading and/or optical proximity effects, endcaps 109 and 111 may be longer or shorter than designed. When endcaps 109 and 111 are longer than designed, gates 102 and 104 may be shorted, causing device failure. Conversely, problems may also occur if endcaps 109 and 111 are shorter than designed (referred to as line-end shortening), as shown in FIG. 2. If endcap 109 or 111 is recessed into active region 106 or 107, they cannot effectively control and turn off the channels of the respective MOS devices 108 and 105. As a consequence, significant leakage currents may exist between the source and drain of devices 108 and 105.

To solve the above-discussed problem, in the formation of the gates, two cut processes were used. Referring to FIG. 3, active regions 202 and 204 are formed close to each other. Gate strips 206 and 208 are first formed by blanket forming a gate electrode layer, and performing a first cut. Gate strips 206 and 208 extend all the way from over active region 202 to over active region 204. Next, a mask is made to cover active regions 202 and 204, and the portions of gate strips 206 and 208 directly over active regions 202 and 204. Opening 210 is formed in the mask to expose portions of gate strips 206 and 208. A second cut is performed to remove the portions of gate strips 206 and 208 exposed through opening 210. Advantageously, at the time the second cut is started, there is no exposed line end, and hence the line-end shortening problem is substantially eliminated.

The solution provided in FIG. 3, however, only applies if the gates over active region 202 and the gates over active region 204 have a same pitch. If different pitches are adopted, as shown in FIG. 4, the above-discussed solution is no longer usable. FIG. 4 illustrates a case, in which the pitch P of the gates over active region 202 is different from the pitch P' of the gates over active region 204. In this case, gate electrode 206 extends from over active region 202 to over active region 204, while gate strips 230 and 232 cannot be aligned to form a single gate strip. As a result, endcaps 220 and 222 are exposed before the second cut is conducted. In the second cut, endcaps 220 and 222 will be etched more than the gates formed from gate strip 206, and hence the line-end shortening problem may occur. A solution is thus needed.

SUMMARY OF THE INVENTION

In accordance with one aspect of the present invention, a method of forming an integrated circuit structure includes providing a substrate including a first active region, and a second active region adjacent to the first active region; forming a gate electrode layer over the substrate; and etching the gate electrode layer. The remaining portions of the gate electrode layer include a first gate strip; a second gate strip substantially parallel to the first gate strip, wherein a first lengthwise direction of the first gate strip is substantially parallel, and misaligned to, a second lengthwise direction of the second gate strip; and a sacrificial strip having a lengthwise direction unparallel to the first lengthwise direction and the second lengthwise direction. The sacrificial strip is between the first active region and the second active region. The sacrificial strip interconnects the first gate strip and the second gate strip. The method further includes forming a mask layer covering portions of the first gate strip and the second gate strip, wherein the sacrificial strip and portions of the first gate strip and the second gate strip connected to the sacrificial strip are exposed through an opening in the mask layer; and etching the sacrificial strip and the portions of the first gate strip and the second gate strip exposed through the opening.

In accordance with another aspect of the present invention, a method of forming an integrated circuit structure includes providing a substrate including a first active region; a second active region adjacent to the first active region; and an insulation region between and adjoining the first active region and the second active region. The method further includes forming a gate dielectric layer over the substrate; forming a gate electrode layer over the gate dielectric layer; and etching the gate electrode layer. The remaining portions of the gate electrode layer include a first gate strip over the first active region; a second gate strip over the first active region; a third gate strip over the second active region; a fourth gate strip over the second active region, wherein the first gate strip, the second gate strip, the third gate strip and the fourth gate strip are substantially parallel to each other, with each including a portion extending over the insulation region; and a sacrificial strip over the insulation region and having a lengthwise direction substantially perpendicular to a lengthwise direction of the first gate strip. The sacrificial strip interconnects the first gate strip and the third gate strip. The method further includes forming a mask layer covering portions of the first gate strip, the second gate strip, the third gate strip, and the fourth gate strip directly over the first active region and the second active region, wherein the sacrificial strip is exposed through an opening in the mask layer; and etching the sacrificial strip through the opening.

In accordance with yet another aspect of the present invention, a method of forming an integrated circuit structure includes providing a substrate including a first active region; a second active region adjacent to the first active region; and an insulation region between and adjoining the first active region and the second active region. The method further includes forming a gate dielectric layer over the substrate; forming a gate electrode layer over the gate dielectric layer; and performing a first patterning to the gate electrode layer. The remaining portions of the gate electrode layer include a first gate strip over the first active region, the first gate strip having a first lengthwise direction; a second gate strip over the second active region, the first gate strip having a second lengthwise direction, wherein the first gate strip and the second gate strip have different widths, and wherein the first lengthwise direction and the second lengthwise direction are substantially aligned; and a sacrificial strip directly over the insulation region and having a third lengthwise direction perpendicular to the first lengthwise direction. The sacrificial strip interconnects the first gate strip and the second gate strip and has a length greater than a first width of the first gate strip and a second width of the second gate strip. The method further includes forming a photo resist covering the first active region and the second active region and portions of the first gate strip and the second gate strip, wherein the photo resist includes an opening exposing the sacrificial strip and additional portions of the first gate strip and the second gate strip; etching the sacrificial strip and the additional portions of the first gate strip and the second gate strip; and removing the photo resist.

The advantageous features of the present invention include reduced endcap shortening problem caused by irregular gate strips resulting from the first cuts. No additional process steps are needed.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The preferred embodiments of the present invention are illustrated in FIGS. 5A through 8, wherein like reference numbers are used to designate like elements throughout the various views and illustrative embodiments of the present invention. Variations of the preferred embodiments are then discussed.

Figure 1:
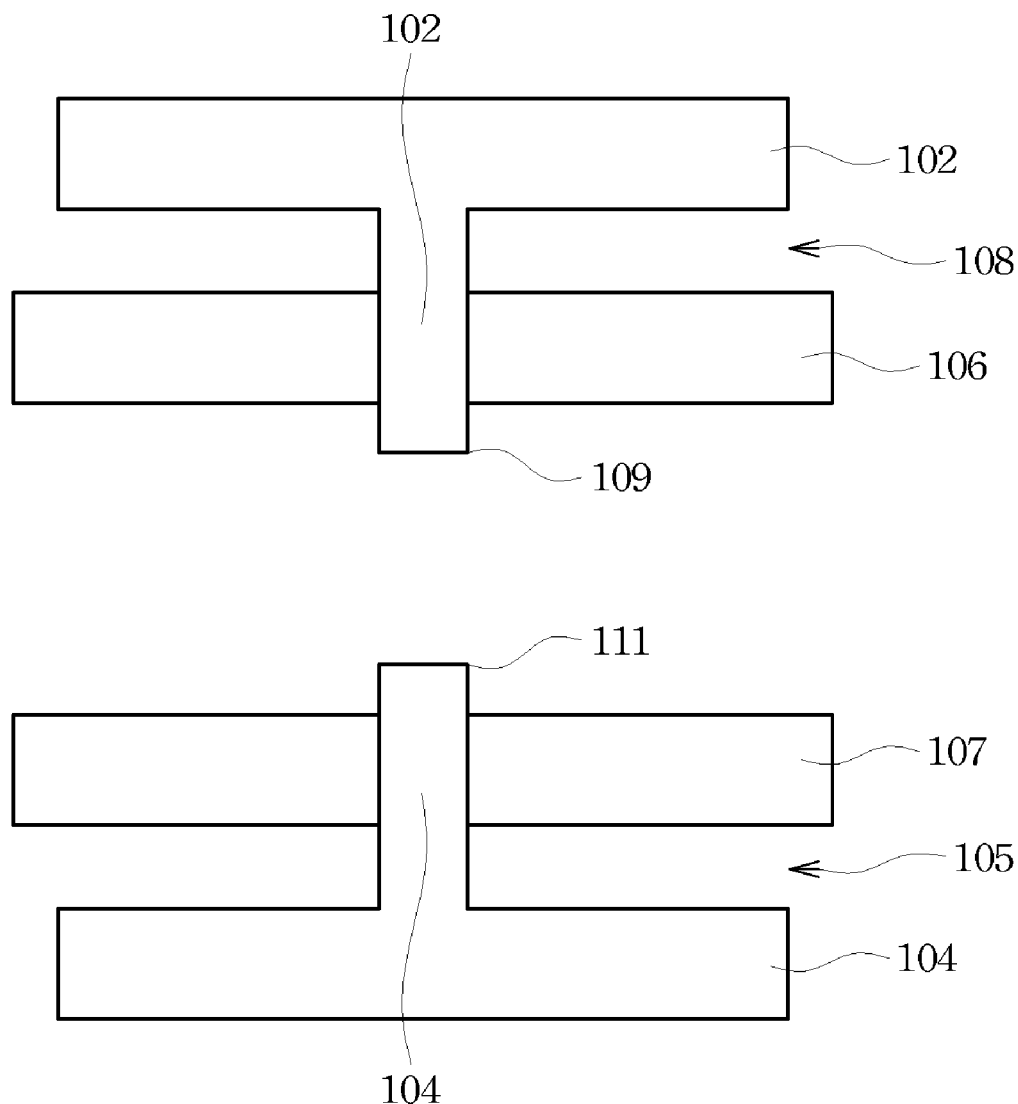
FIGS. 1 and 2 illustrate a convention structure, in which the line-end shortening problem may occur.
Figure 2:
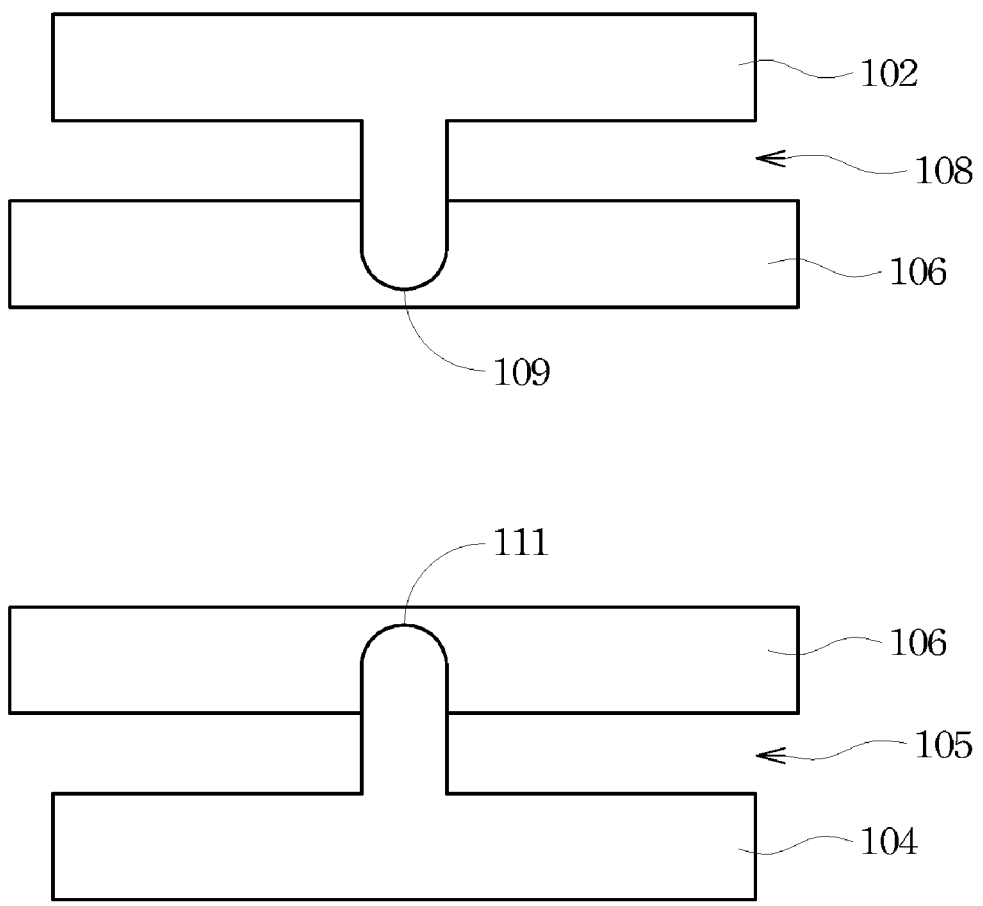
Figure 3:
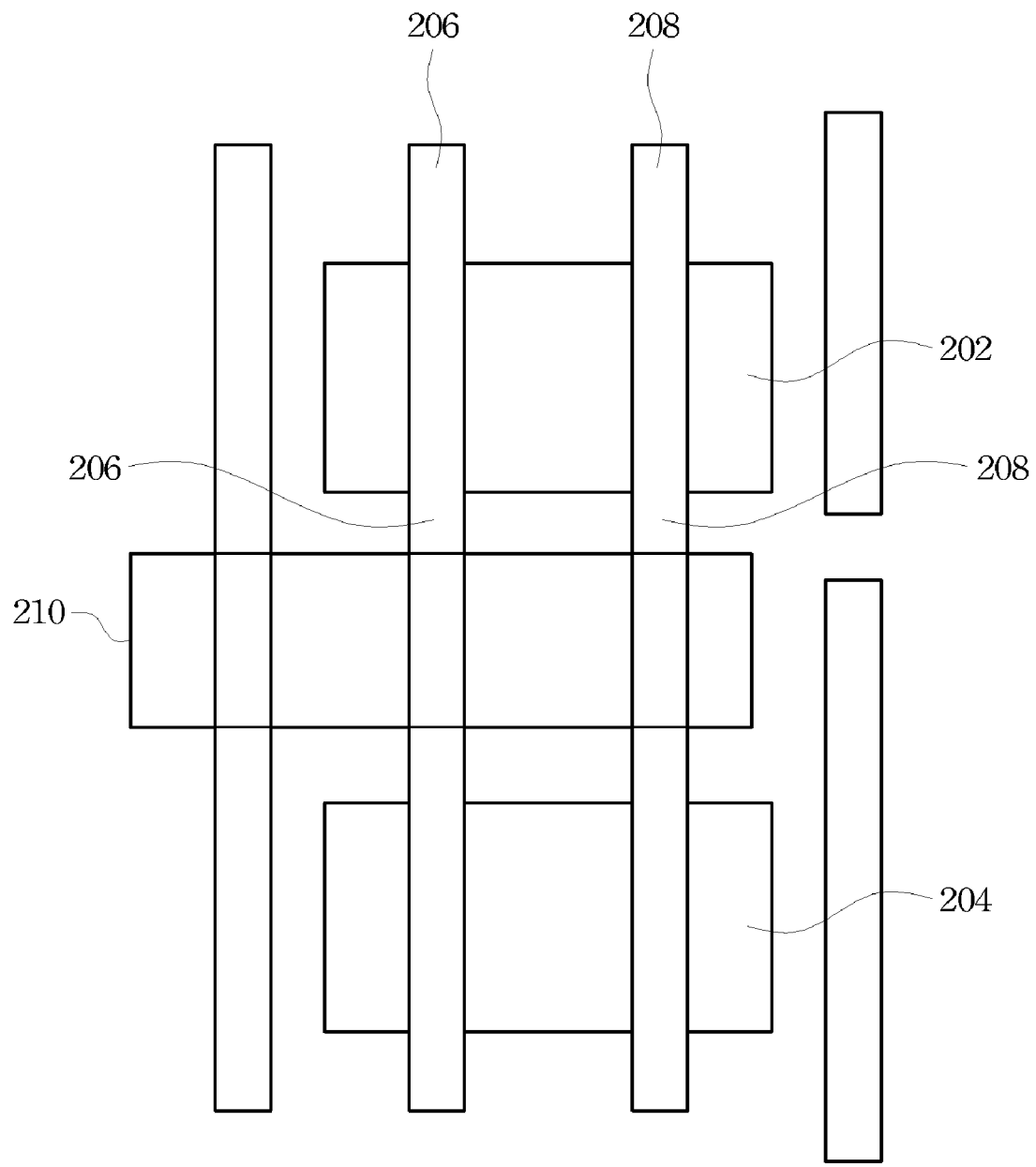
FIG. 3 illustrates a conventional method for forming gate electrodes, wherein the line-end shortening problem is solved by forming gate electrodes using two cuts.
Figure 4:
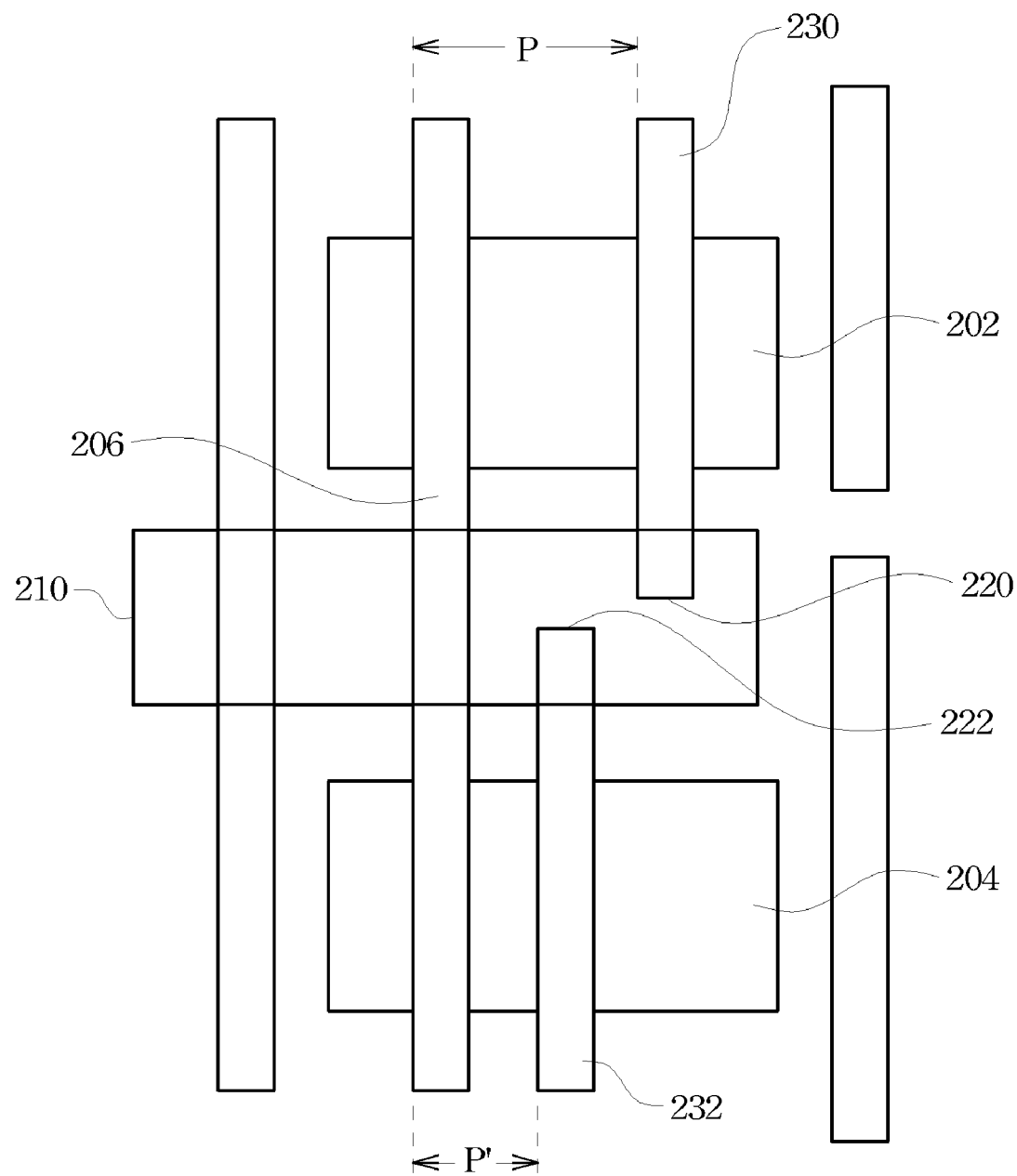
FIG. 4 illustrates a case in which the line-end shortening problem cannot be solved by the two-cut process.
Figure 5A:
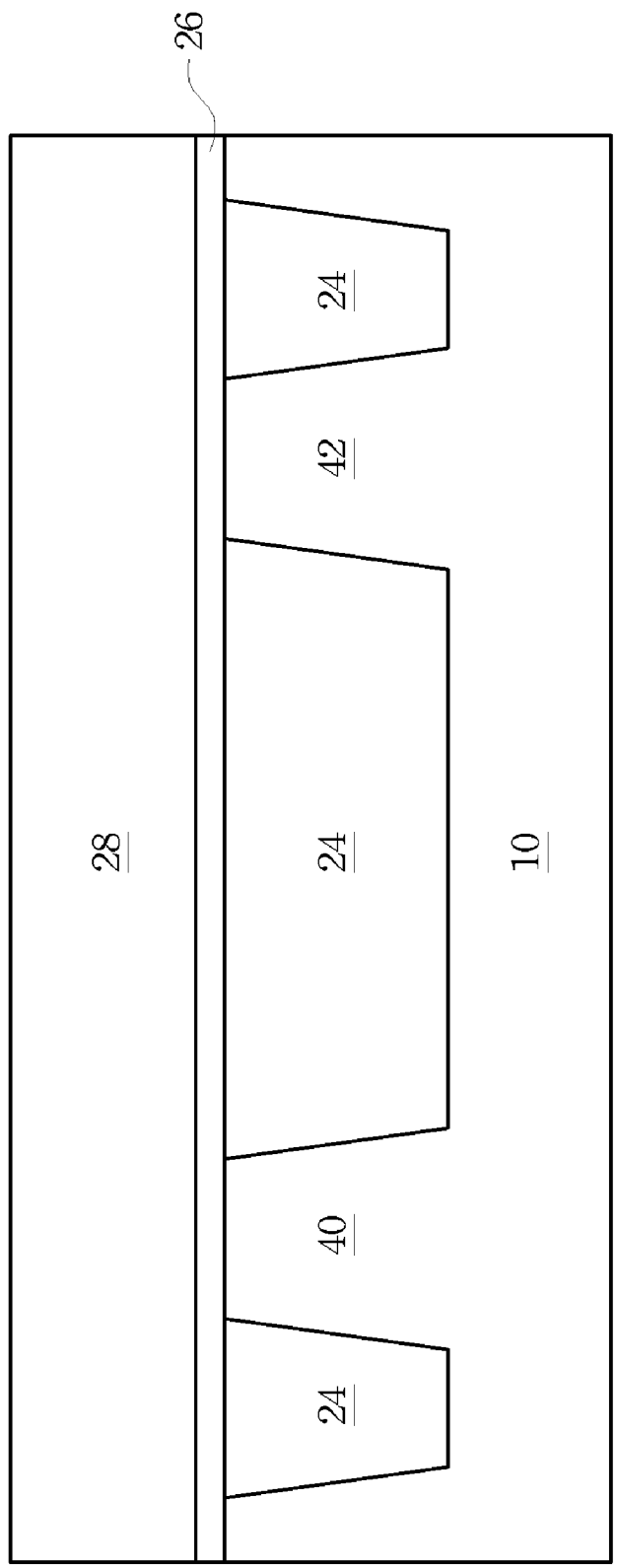
FIGS. 5A through 10 are top views and cross-sectional views of the embodiments of the present invention, wherein sacrificial gate electrodes are formed to interconnect gate strips.

FIG. 5A illustrates a cross-sectional view of an initial structure including substrate 10, which may be formed of commonly used semiconductor such as silicon, silicon germanium, or the like. Substrate 10 comprises active regions 20, 22 (not shown in FIG. 5A, please refer to FIG. 5B) and active regions 40 and 42, on which MOS devices can be formed. Active regions 20, 22, 40 and 42 may be doped with a desirable n-type or p-type impurity to form well regions (not shown). Also, active regions 20 and 22 may be of a same conductivity type or different conductivity types, and active regions 40 and 42 may be of a same conductivity type or different conductivity types. The boundaries of active regions may be defined by insulation structures 24. In an embodiment, insulation structures 24 are shallow trench isolations. In the illustrated embodiment, active regions 20 and 22 are closely located, and active regions 40 and 42 are closely located.

Gate dielectric layer 26 is formed over substrate 10 and active regions 20, 22, 40, and 42. Gate dielectric layer 26 may be formed of thermal oxidation or commonly used deposition methods, and hence may include silicon oxide. Alternatively, gate dielectric layer 26 may comprise oxynitrides, nitrides, high-k materials, and/or the like. Gate electrode layer 28 is formed on gate dielectric layer 26. Gate electrode layer 28 may be formed of polysilicon, although it may also be formed of metals or metal compounds comprising, for example, titanium, tungsten, cobalt, aluminum, nickel, and/or combinations thereof.

Figure 5B:
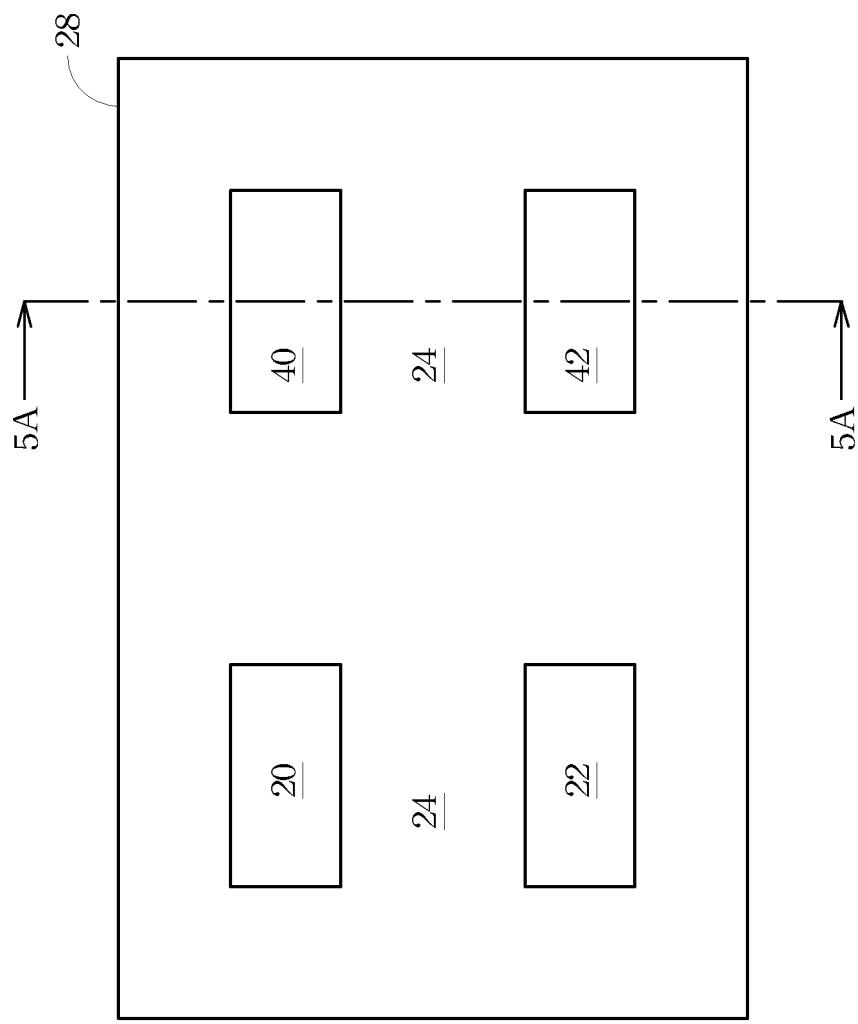

FIG. 5B illustrates a top view of the structure shown in FIG. 5A, wherein the cross-sectional view shown in FIG. 5A is taken along a plane crossing line 5A-5A in FIG. 5B. The cross-sectional view of active regions 20 and 22, although not shown, is similar to what is shown in FIG. 5A. Gate electrode layer 28 may cover an entirety of the respective semiconductor chip, in which active regions 20, 22, 40, and 42 are formed.

Figure 6A:
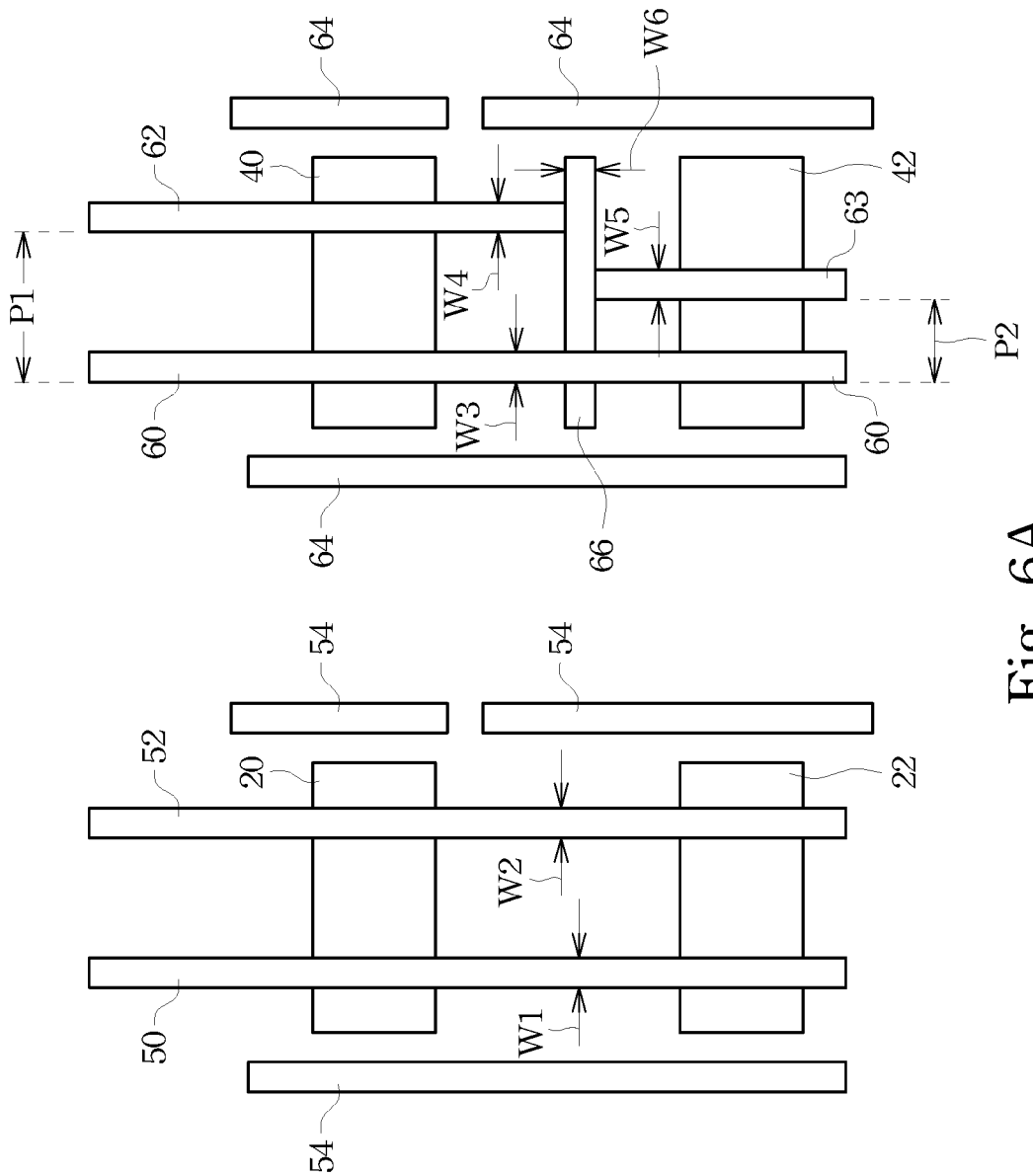

Referring to FIG. 6A, gate electrode layer 28 and gate dielectric layer 26 are patterned to form gate electrode strips 50, 52, 60, 62, and 63. The respective patterning process is also referred to as a first cut throughout the description. For simplicity, the photo resist used in the first cut is not shown. Gate electrode strips 50 and 52 are substantially parallel to each other, and extend from over active region 20 to over active region 22. In an embodiment of the present invention, the width W1 of gate electrode strip 50 is equal to the gate width W2 of gate electrode strip 52. In alternative embodiments, width W1 is different from width W2. Dummy gate strips 54 may be formed adjacent to gate electrode strips 50 and 52.

Gate strips 60, 62, and 63 are formed over active regions 40 and 42, and are substantially parallel to each other. Gate strip 60 extends from over active region 40 to over active region 42. Gate strips 62 and 63 are substantially parallel, but misaligned to each other. Gate strips 60 and 62 have a first pitch P1, gate strips 60 and 63 have a second pitch P2 different from P1. Each pair of widths W3, W4, and W5 of gate strips 60, 62, and 63 may be equal to each other, or different from each other. Dummy gate strips 64 may be formed adjacent to gate electrode strips 60, 62 and 63.

Clearly, with pitch P1 different from pitch P2, gate strips 62 and 63 cannot be connected seamlessly to form a single gate strip. Sacrificial strip 66 is thus formed to connect gate strips 62 to 63. Preferably, as shown in FIG. 6A, sacrificial strip 66 has a lengthwise direction substantially perpendicular to lengthwise directions of gate strips 62 and 63. Throughout the description, the term "lengthwise direction" refers to the direction in the length of the respective gate strips. In an embodiment, sacrificial strip 66 has a length greater than widths W4 and W5, and hence extends beyond gate strips 62 and 63. Further, sacrificial strip 66 may be long enough to connect to, and possibly extend beyond, gate strip 60. In alternative embodiments, sacrificial strip 66 starts from gate strip 62 and ends at gate strip 63, as is shown in FIG. 6B. Width W6 of sacrificial strip 66 is preferably substantially equal to widths W3, W4 and W5. In the case widths W3, W4 and W5 are different from each other, width W6 may adopt an intermediate value of widths W3, W4 and W5, although other values may also be used. Preferably, no sacrificial strip is left between active regions 20 and 22 to connect gate strips 50 and 52, although such a sacrificial strip can also be formed.

Figure 7:
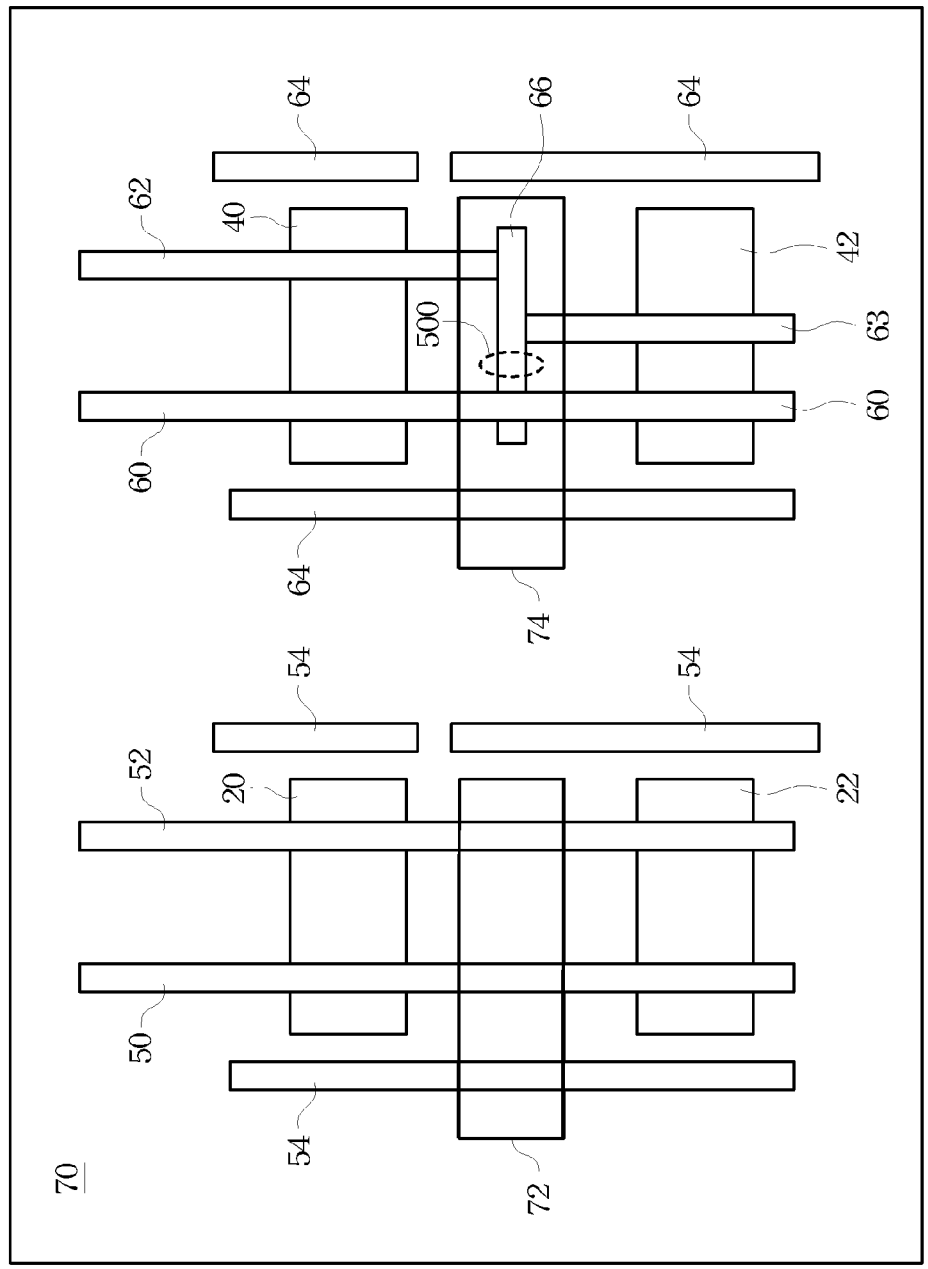

Referring to FIG. 7, mask 70, for example, a photo resist, is formed to cover active regions 20, 22, 40, and 42, and portions of gate strips 50, 52, 60, 62 and 63. Openings 72 and 74 are formed in mask 70 to expose the portions of gate strips 50 and 52 between active regions 20 and 22, and the portions of gate strips 60, 62, and 63 between active regions 40 and 42. The portions of dummy gate strips 54 and 64 may also be exposed. Preferably, an entirety of sacrificial strip 66 is exposed through opening 74. Alternatively, the portion of sacrificial strip 66 connecting gate strips 60, 62 and 63 is exposed, while sacrificial strip 66 still has unexposed portions. The unexposed portions of sacrificial strip 66 will accordingly become dummy patterns after the second cut, as will be discussed in subsequent paragraphs.

Figure 8:
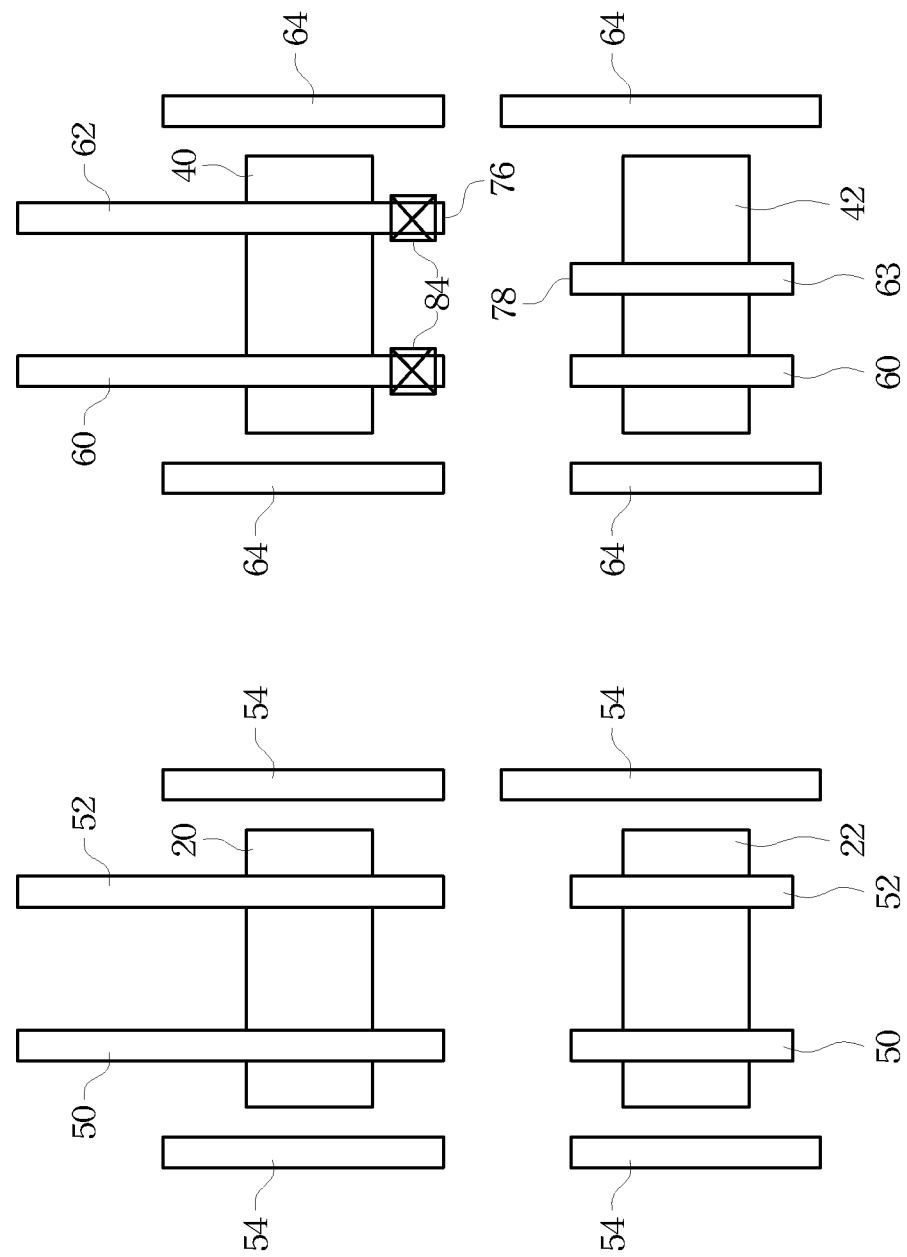

Next, as shown in FIG. 8, exposed portions of gate strips 50, 52, 60, 62, and 63 and sacrificial strip 66 are etched, followed by the removal of mask 70. The resulting structure is shown in FIG. 8. In the resulting structure, the remaining portions of gate strips 50, 52, 60, 62, and 63 form MOS devices with the respective underlying active regions 20, 22, 40, and 42. Advantageously, with the formation of sacrificial strip 66, which prevents the excessive etching (for example, from endcaps of gate strips 62 and 63) of gate strips 62 and 63 during the second cut, the line-end shortening problem of endcaps 76 and 78 is substantially eliminated.

Figure 9:
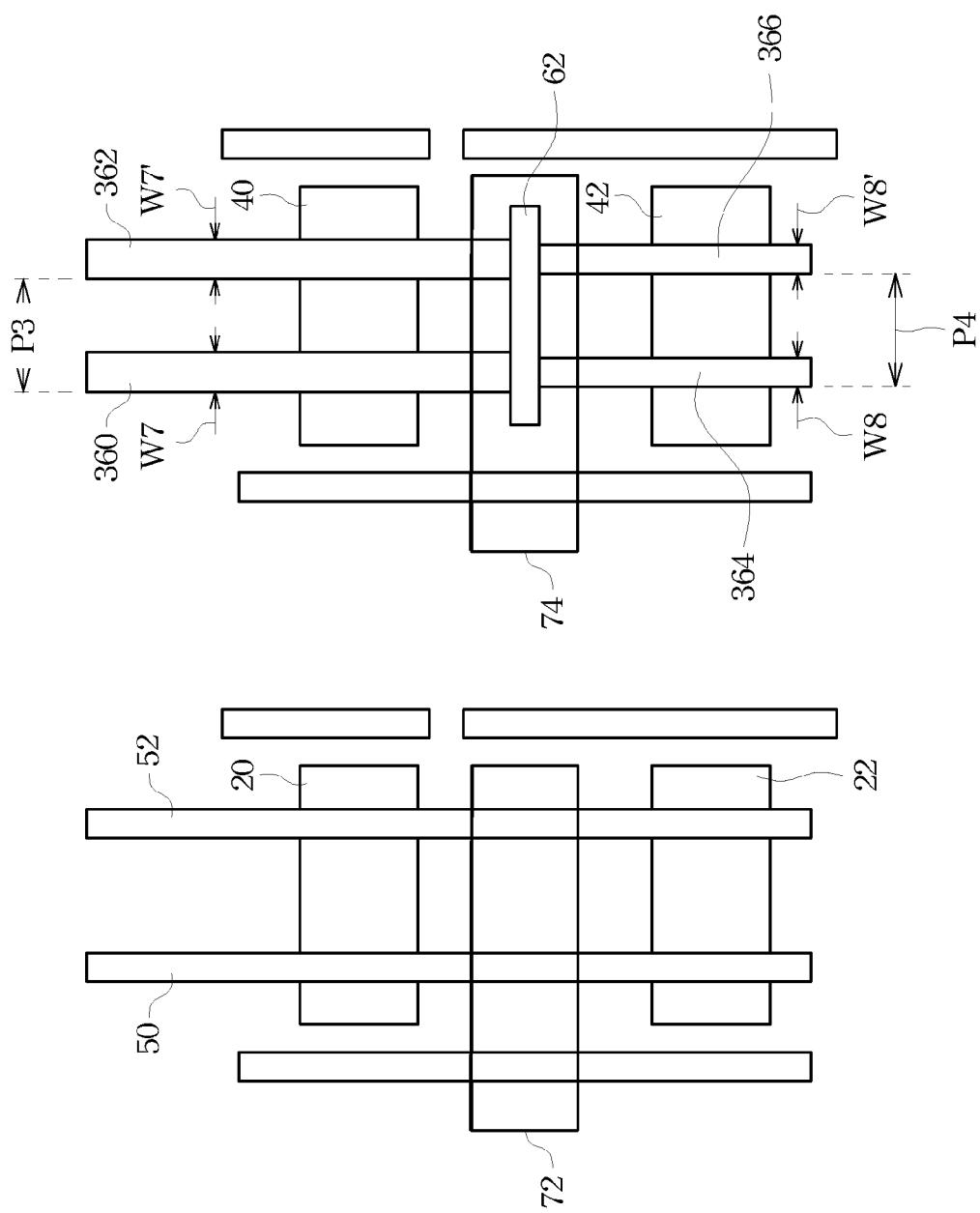
Figure 10:
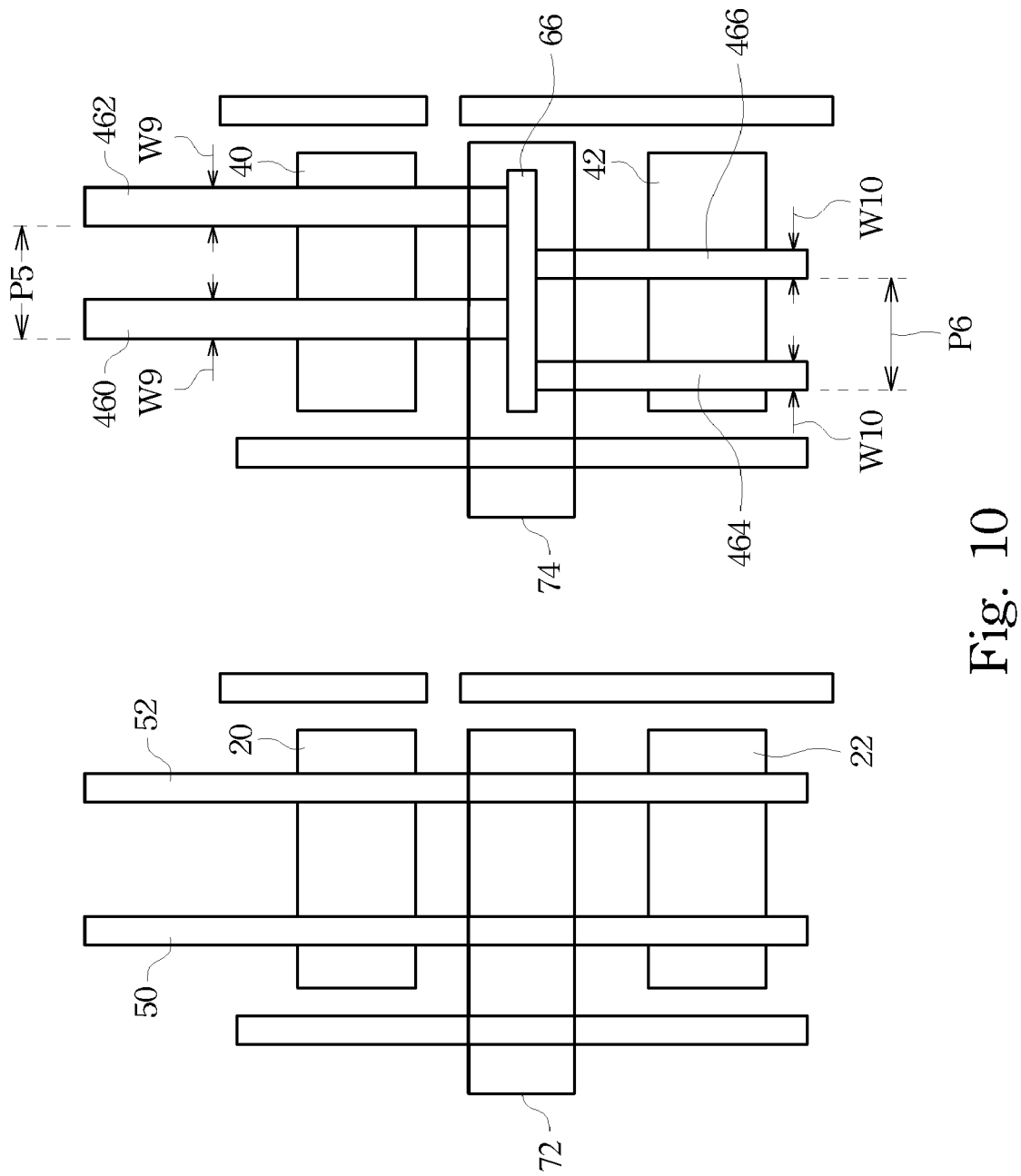

FIGS. 9 and 10 illustrate alternative embodiments in which the concept of the present invention may be applied. Referring to FIG. 9, the pitch P3 of gate strips 360 and 362 is substantially equal to the pitch P4 of gate strips 364 and 366. However, width W7 of gate strip 360 is different from width W8 of gate strip 364. Width W7' of gate strip 362 may be equal to or different from width W8' of gate strip 366. In this case, sacrificial strip 66 may also be used to connect gate strips 360 and 364. Sacrificial strip 66 may also be connected to gate strips 362 and 366, particularly if they have different widths. The formation of sacrificial strip 66 is particularly helpful if width W7 (or W7') is significantly different from width W8 (or W8'), which will result in a significant end portion of gate strip 360 (or end portion of gate strip 362) to be exposed if sacrificial strip 66 is not formed.

FIG. 10 illustrates an alternative embodiment, wherein the pitch P5 of gate strips 460 and 462 is substantially equal to the pitch P6 of gate strips 464 and 466, and width W9 of gate strips 460 and 462 is substantially equal to the width W10 of gate strips 464 and 466. However, gate strips 460 and 464 are substantially misaligned, and gate strips 462 and 466 are substantially misaligned. Again, sacrificial strip 66 may be added to interconnect gate strips 460 and 464, and/or to interconnect gate strips 462 and 466. The scheme shown in FIG. 10 provides flexibility to the layout of the MOS devices, so that their gates do not have to be aligned, while the line-end shortening problem can still be avoided.

In each of the embodiments shown in FIGS. 9 and 10, although sacrificial layer 66 is shown as connecting all gate strips, discrete sacrificial strips 66 may be formed. For example, in FIG. 7, the portion of sacrificial strips 66 inside dotted frame 500 may be removed by the first cut, and hence there will be a portion of sacrificial strip 66 to the left of frame 500, and a portion of a sacrificial strip 66 to the right of frame 500, but no interconnection portion in frame 500.

By using preferred embodiments of the present invention, significant flexibility is provided to the design and layout of integrated circuits without causing the line-end shortening problem. Accordingly, there is no need to add extra margin to the portion of gates extending beyond active regions, and hence chip area may be saved. Further, referring back to FIG. 8, in the case contacts 84 are to be formed close to where the second cut is performed, no extra margin is needed. Advantageously, the sacrificial strips of the present invention may be generated by optical proximity correction (OPC) tools, computer aided design tools, and/or in the logic operation in the making of lithography masks. No added process steps and lithography processes are needed.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming an integrated circuit structure, the method comprising:
  providing a substrate comprising:
    a first active region;
    a second active region adjacent to the first active region; and
    an insulation region between and adjoining the first active region and the second active region;
  forming a gate dielectric layer over the substrate;
  forming a gate electrode layer over the gate dielectric layer;
  etching the gate electrode layer, wherein remaining portions of the gate electrode layer comprise:
    a first gate strip over the first active region;
    a second gate strip over the first active region;
    a third gate strip over the second active region;
    a fourth gate strip over the second active region, wherein the first gate strip, the second gate strip, the third gate strip and the fourth gate strip are substantially parallel to each other, with each comprising a portion extending over the insulation region; and a sacrificial strip over the insulation region and having a lengthwise direction substantially perpendicular to a lengthwise direction of the first gate strip, wherein the sacrificial strip interconnects the first gate strip and the third gate strip;

forming a mask layer covering portions of the first gate strip, the second gate strip, the third gate strip, and the fourth gate strip directly over the first active region and the second active region, wherein the sacrificial strip is exposed through an opening in the mask layer; and etching the sacrificial strip through the opening.

2. The method of claim 1, wherein during the step of etching the sacrificial strip, additional portions of the first gate strip, the second gate strip, the third gate strip, and the fourth gate strip directly exposed through the opening are etched.

3. The method of claim 1, wherein the first gate strip and the third gate strip are misaligned in lengthwise directions of the first gate strip and the third gate strip.

4. The method of claim 3, wherein before the step of etching the sacrificial strip, the second gate strip and the fourth gate strip are substantially aligned and forming a substantially straight strip, and wherein the sacrificial strip is further connected to the second gate strip and the fourth gate strip.

5. The method of claim 1, wherein the first gate strip and the third gate strip are substantially aligned and have different widths.

6. The method of claim 5, wherein before the step of etching the sacrificial strip, the second gate strip and the fourth gate strip are substantially aligned and have different widths, and wherein the sacrificial strip is further connected to the second gate strip and the fourth gate strip.

7. The method of claim 1, wherein the first gate strip and the third gate strip have a first pitch, and the second gate strip and the fourth gate strip have a second pitch substantially equal to the first pitch.

8. The method of claim 1, wherein the first gate strip and the third gate strip have a first pitch, and the second gate strip and the fourth gate strip have a second pitch different from the first pitch.

9. A method of forming an integrated circuit structure, the method comprising:

providing a substrate comprising:
a first active region;
a second active region adjacent to the first active region; and
an insulation region between and adjoining the first active region and the second active region;

forming a gate dielectric layer over the substrate;
forming a gate electrode layer over the gate dielectric layer;
performing a first patterning to the gate electrode layer, wherein remaining portions of the gate electrode layer comprise:
a first gate strip over the first active region, the first gate strip having a first lengthwise direction;
a second gate strip over the second active region, the first gate strip having a second lengthwise direction, wherein the first gate strip and the second gate strip have different widths, and wherein the first lengthwise direction and the second lengthwise direction are substantially aligned; and
a sacrificial strip directly over the insulation region and having a third lengthwise direction perpendicular to the first lengthwise direction, wherein the sacrificial strip interconnects the first gate strip and the second gate strip and has a length greater than a first width of the first gate strip and a second width of the second gate strip;

forming a photo resist covering the first active region and the second active region and portions of the first gate strip and the second gate strip, wherein the photo resist comprises an opening exposing the sacrificial strip and additional portions of the first gate strip and the second gate strip;

etching the sacrificial strip and the additional portions of the first gate strip and the second gate strip; and removing the photo resist.

10. The method of claim 9, wherein the sacrificial strip has a width no less than a smaller one of the first gate strip and the second gate strip.

11. The method of claim 9, wherein the sacrificial strip is further connected to a third gate strip having a portion directly over the first active region, wherein the third gate strip is parallel to the first gate strip and the second gate strip.

* * * * *